United States Patent
Yun

(10) Patent No.: US 8,283,838 B2
(45) Date of Patent: Oct. 9, 2012

(54) PIEZOELECTRIC LINEAR MOTOR OFFERING ENHANCED DISPLACEMENT

(75) Inventor: Man Sun Yun, Gheongju (KR)

(73) Assignees: Inova Inc., Chungbuk (KR); Santoma, Ltd., Kowloon (HK)

( * ) Notice: Subject to any disclaimer, the term of this patent is extended or adjusted under 35 U.S.C. 154(b) by 308 days.

(21) Appl. No.: 12/297,248

(22) PCT Filed: Apr. 11, 2007

(86) PCT No.: PCT/KR2007/001760
§ 371 (c)(1),
(2), (4) Date: Sep. 10, 2009

(87) PCT Pub. No.: WO2007/119960
PCT Pub. Date: Oct. 25, 2007

(65) Prior Publication Data
US 2010/0102674 A1    Apr. 29, 2010

(30) Foreign Application Priority Data
Apr. 17, 2006 (KR) .................. 10-2006-0034639

(51) Int. Cl.
*H02N 2/04* (2006.01)
(52) U.S. Cl. .............. 310/323.02; 310/369; 310/371
(58) Field of Classification Search ............... 310/323, 310/369, 371
See application file for complete search history.

(56) References Cited

U.S. PATENT DOCUMENTS

| | | | | |
|---|---|---|---|---|
| 5,780,958 A | * | 7/1998 | Strugach et al. | 310/348 |
| 5,917,271 A | * | 6/1999 | Yamamura | 310/328 |
| 6,140,745 A | * | 10/2000 | Bryant | 310/353 |
| 2003/0073952 A1 | * | 4/2003 | Flaherty et al. | 604/151 |
| 2006/0113878 A1 | * | 6/2006 | Pei et al. | 310/363 |
| 2006/0238079 A1 | * | 10/2006 | Pei et al. | 310/339 |
| 2006/0261706 A1 | * | 11/2006 | Yoon et al. | 310/328 |
| 2007/0120442 A1 | * | 5/2007 | Piotr et al. | 310/323.01 |
| 2009/0127974 A1 | * | 5/2009 | Piotr et al. | 310/317 |

* cited by examiner

*Primary Examiner* — Walter Benson
*Assistant Examiner* — Bryan Gordon
(74) *Attorney, Agent, or Firm* — Rosenberg, Klein & Lee

(57) ABSTRACT

A piezoelectric linear motor for providing enhanced displacement using a dome-shaped piezoelectric ceramic is provided. The piezoelectric linear motor includes a dome-shaped piezoelectric ceramic (100) processed such that different electrodes are formed on opposite surfaces of the piezoelectric ceramic. A vibration shaft (200) is fixed to a first surface of the piezoelectric ceramic so that the vibration shaft moves in conjunction with displacement of the piezoelectric ceramic. A movable element (300) is linearly driven through friction with the vibration shaft while coming into contact with the vibration shaft. The movable element moves in a movement direction of the vibration shaft if the inertial force of the movable element is less than the frictional force between the movable element and the vibration shaft when the vibration shaft moves. According to the present invention, the piezoelectric ceramic is formed in a dome shape, so that movement displacement is enhanced.

4 Claims, 6 Drawing Sheets

(a)

(b)

(c)

(a)

(b)

(a)

(b)

PIEZOELECTRIC LINEAR MOTOR OFFERING ENHANCED DISPLACEMENT

TECHNICAL FIELD

The present invention relates to a piezoelectric linear motor, which employs a dome-shaped piezoelectric ceramic, thus providing enhanced displacement compared to the displacement obtained upon the simple expansion/contraction of a conventional disk-shaped piezoelectric ceramic.

BACKGROUND ART

A piezoelectric motor is a next-generation motor using the piezoelectric effect of a piezoelectric ceramic which vibrates according to variation in an electric field applied thereto. The piezoelectric motor denotes a noiseless motor having an ultrasonic driving frequency above 20 KHz, which is beyond the range of human hearing, and is also called an ultrasonic motor. Compared to a typical electromagnetic motor, a piezoelectric motor has a generation force of 3 kg cm or less, a response speed of 0.1 ms or less, a size that one tenth the size of a typical electromagnetic motor or smaller, and a precision of 0.1 m or smaller. Accordingly, the piezoelectric motor has been widely used in application fields requiring high level torques and low speeds, such as the implementation of the zoom function, auto-focusing function, and shake reduction function of digital cameras, or the driving of a pickup lens in a Compact Disc (CD)/Digital Versatile Disc (DVD)-Read Only Memory (ROM) drive.

Generally, a piezoelectric motor can be implemented using a vibration propagation method, such as a flexural wave type or standing wave type, but this vibration propagation method is disadvantageous in that it is difficult to obtain a given desired amplitude due to the abrasion of a contact portion when the piezoelectric motor is continuously driven.

Korean Patent Registration No. 10-0443638 (the prior art) was proposed as an alternative measure for overcoming this disadvantage, and relates to a piezoelectric linear motor, which linearly moves a movable element mounted on a movable shaft by utilizing a bending motion performed through an elastic body and a piezoelectric plate as a driving source.

The piezoelectric linear motor disclosed in the prior art is advantageous in that it has a small size and a relatively simple manufacturing process and provides a fast operating speed, compared to conventional motors, but is problematic in that, since the piezoelectric ceramic is formed in a disk shape, a separate elastic plate must be joined thereto to obtain displacement, so that the manufacturing cost thereof increases, and the manufacturing process thereof is complicated. Further, according to the prior art, the movement displacements of the movable shaft and movable element are limited to certain magnitudes, thus limiting the range of products to which the motor can be applied in proportion to the limited magnitudes.

DISCLOSURE

Technical Problem

Accordingly, the present invention has been made keeping in mind the above problems occurring in the prior art, and an object of the present invention is to provide a piezoelectric linear motor, which can obtain vibration displacement without requiring a separate elastic plate to be joined to a piezoelectric ceramic, and can provide linear vibration displacement improved over that of a disk-shaped piezoelectric ceramic, thus further extending the range of application of the piezoelectric linear motor while increasing the moving efficiency of the piezoelectric linear motor.

Advantageous Effects

Accordingly, the present invention, having the above construction, is advantageous in that there is no need to provide a separate elastic plate to obtain vibration displacement, rather, a piezoelectric ceramic alone is formed in a dome shape, thus simplifying the manufacturing process, which is otherwise complicated by the attachment of an elastic body, and decreasing the manufacturing cost, and in that the vibration displacement or the operation scale of a piezoelectric linear motor can be enhanced compared to the case where a conventional disk-shaped piezoelectric ceramic is employed, thus further extending the range of products to which the motor can be applied.

BEST MODE

Figure 1:
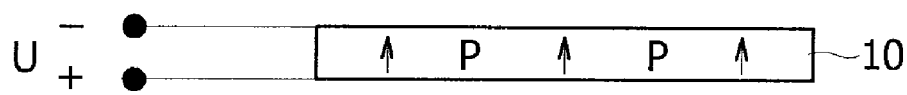
FIGS. 1(a) to 1(c) are conceptual views showing the principles of the formation of the displacement of a typical piezoelectric motor.
Figure 1:
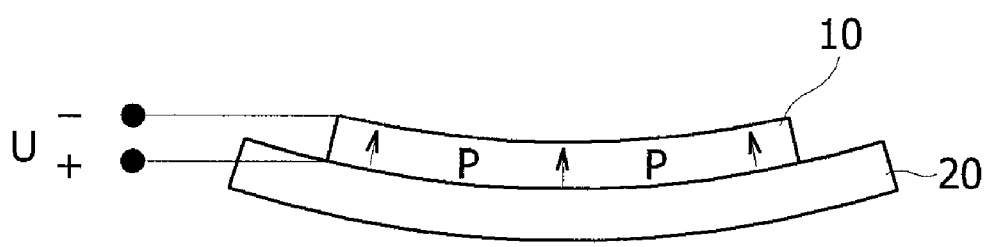
Figure 1:
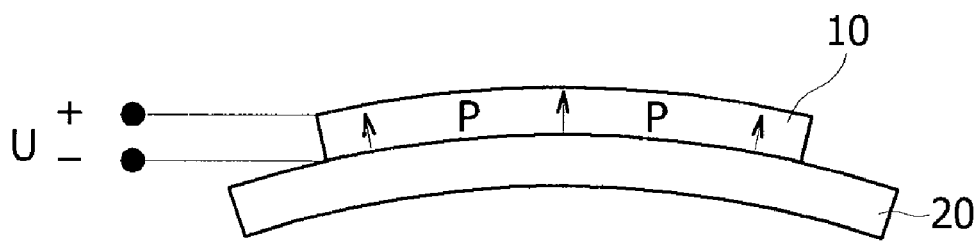

In order to accomplish the above object, the present invention provides a piezoelectric linear motor for providing enhanced displacement, comprising a dome-shaped piezoelectric ceramic processed such that different electrodes are formed on opposite surfaces of the piezoelectric ceramic, a vibration shaft fixed to a first surface of the piezoelectric ceramic so that the vibration shaft moves in conjunction with displacement of the piezoelectric ceramic, and a movable element linearly driven through friction with the vibration shaft while coming into contact with the vibration shaft. The piezoelectric linear motor may further comprise a bracket for limiting displacement of the piezoelectric ceramic, formed in a circumferential direction thereof, to a predetermined magnitude while supporting the piezoelectric ceramic.

Preferably, the movable element may move in a movement direction of the vibration shaft if an inertial force of the movable element is less than the frictional force between the movable element and the vibration shaft when the vibration shaft moves.

Preferably, the movable element and the vibration shaft may be constructed such that a certain frictional force is maintained at a contact portion between the movable element and the vibration shaft by a predetermined pressing element.

Hereinafter, embodiments of the present invention will be described in detail with reference to the attached drawings. Reference should now be made to the drawings, in which the same reference numerals are used throughout the different drawings to designate the same or similar components.

FIGS. 1(a) to 1(c) are conceptual views showing the principles of the formation of the vibration displacement of a typical piezoelectric linear motor.

In FIG. 1(a), a piezoelectric ceramic 10, polarized in the axial direction (the direction of the arrow) is shown. When an electric field U is applied to form electrodes on the upper surface and lower surface of the piezoelectric ceramic 10, a compressive force or a tensile force is applied to the piezoelectric ceramic 10 due to the inverse piezoelectric effect.

That is, when the polarization direction of the piezoelectric ceramic 10 is identical to the direction of the electric field due to the application of the electric field U, the piezoelectric ceramic 10 is expanded in the circumferential direction thereof while it is contracted in the axial direction thereof. At this time, since the piezoelectric ceramic 10 is strained by an elastic plate 20, the surface of the piezoelectric ceramic 10, to which the elastic plate 20 is attached, has, in the circumferential direction, contraction displacement less than that of the surface to which no elastic plate is attached. As a result, as shown in FIG. 1(b), a combination structure of the elastic plate 20 and the piezoelectric ceramic 10 generates displacement so that the combination structure is bent in the direction of the piezoelectric ceramic 10, and generates the maximum displacement at the center of the unimorph.

In contrast, when the polarization direction of the piezoelectric ceramic 10 is opposite the direction of the electric field due to the application of the electric field U, the piezoelectric ceramic 10 is contracted in the circumferential direction thereof while it is expanded in the axial direction thereof. At this time, contrary to the above case, the surface of the piezoelectric ceramic 10 to which the elastic plate 20 is attached has, in the circumferential direction, expansion displacement less than that of the surface to which no elastic plate is attached. As a result, as shown in FIG. 1(c), a combination structure of the elastic plate 20 and the piezoelectric ceramic 10 generates displacement so that the combination structure is bent in the direction of the elastic plate 20, and generates the maximum displacement at the center of the unimorph.

As described above, it can be seen that, in order to obtain vibration displacement in the disk-shaped piezoelectric ceramic 10, the elastic plate 20 is essentially required in addition to the piezoelectric ceramic 10. In contrast, the present invention is characterized in that the piezoelectric ceramic is formed in the shape of a dome, and thus vibration displacement can be secured using only the ceramic part itself, without requiring a separate elastic plate. In the following description, the principles of the driving of the piezoelectric linear motor according to the present invention are described in detail, that is, the principal components of the piezoelectric linear motor of the present invention are described first, and the principles of the driving of the motor are subsequently described on the basis of the moving tracks of a vibration shaft and a movable element obtained by the application of wave-shaped voltage.

Figure 2:
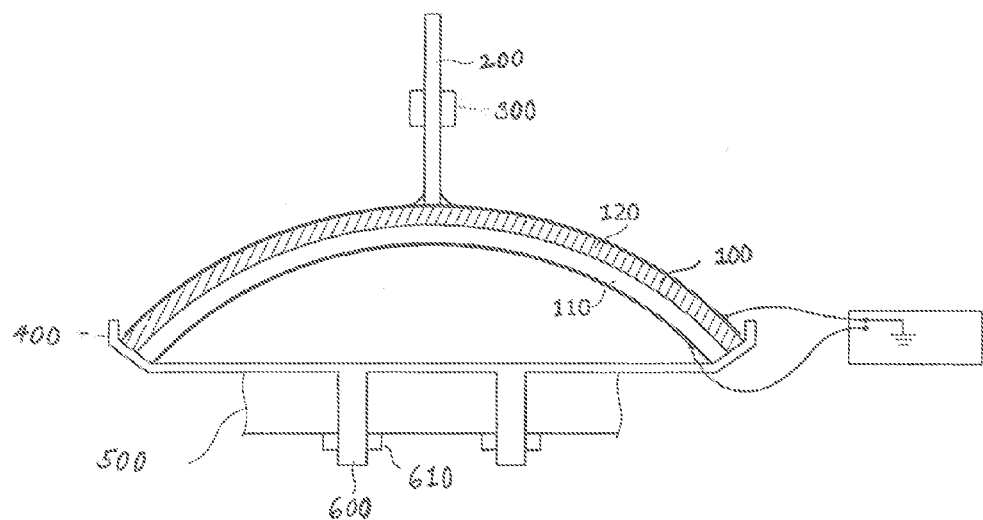
FIG. 2 is a sectional view of a piezoelectric linear motor according to the present invention.

FIG. 2 illustrates the section of a piezoelectric linear motor according to the present invention.

The piezoelectric ceramic 100 is formed in the shape of a dome, on opposite surfaces of which different electrodes 110, 120 are formed, and vibrates in such a way that the piezoelectric ceramic 100 is protruded or retracted in the axial direction depending on variation in the polarity of the voltages applied to the opposite surfaces of the ceramic 100.

In this case, the principles of the generation of vibration in the dome-shaped piezoelectric ceramic (or the principles of the generation of vibration displacement) are described in detail below with reference to the drawings. For reference, FIG. 3 schematically illustrates the direction of a force applied to the dome-shaped piezoelectric ceramic which forms the piezoelectric motor.

That is, when the piezoelectric ceramic 100 forming the piezoelectric motor is contracted in the axial direction, and is expanded in the circumferential direction, and thus the thickness of the dome is decreased, compressive forces are applied to minute elements formed around the shaft due to adjacent minute elements, and a resultant of the compressive forces acts in the direction of the protrusion of the axis, consequently causing the center of the piezoelectric ceramic to protrude. FIG. 3 illustrates the side section of the piezoelectric ceramic 100, but the shape of the ceramic 100 viewed from the above is a concentric disk shape, so that it can be seen that the minute elements formed around the axis are arranged in a ring shape toward the center of the axis. In this case, the results of a simulation, performed on the assumption that no separate strain condition exists on the piezoelectric ceramic 100, can be confirmed in FIG. 4(a), and the results of a simulation viewed in a three-dimensional space can be confirmed in FIG. 4(b).

Figure 3:
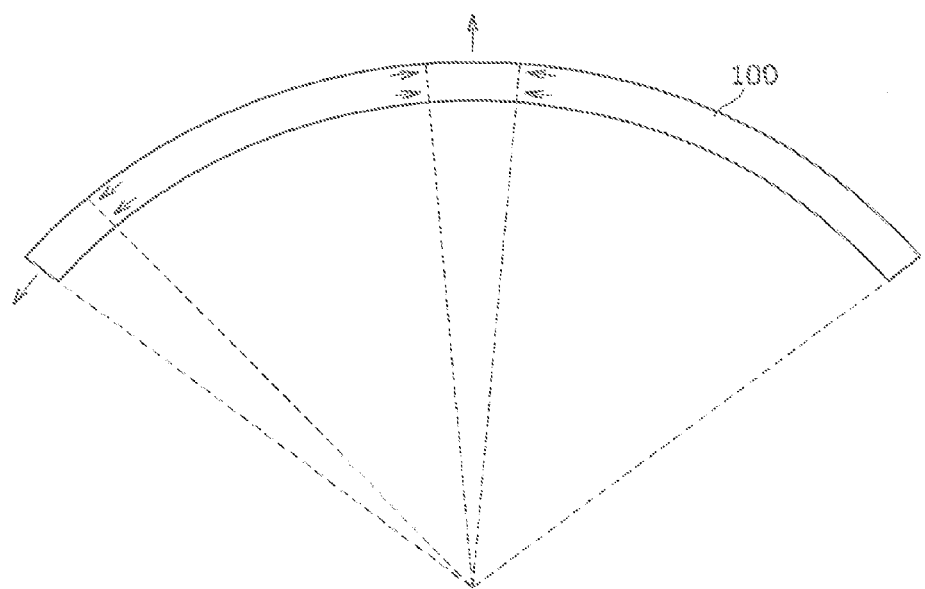
FIG. 3 is a side sectional view of a piezoelectric ceramic for describing the principles of the generation of the displacement of a piezoelectric linear motor according to the present invention.
Figure 4:
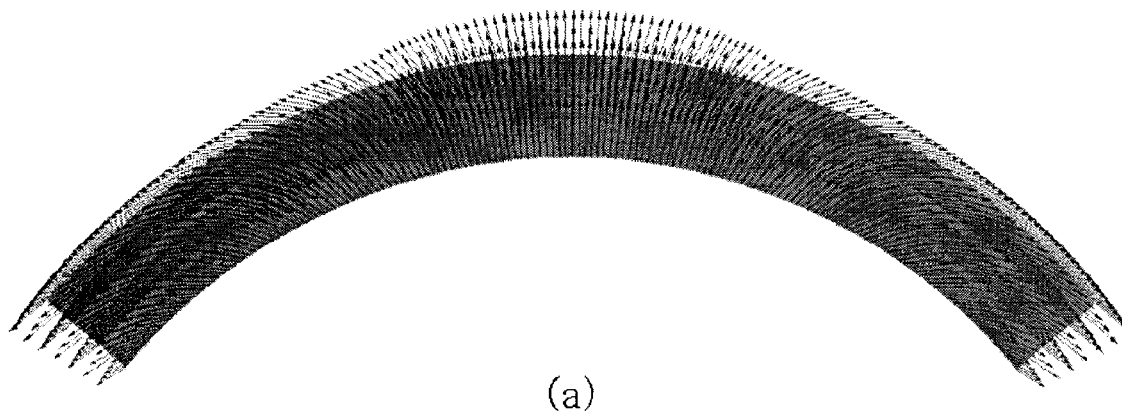
FIGS. 4(a) and 4(b) are views showing the results of the simulation of the displacement of a piezoelectric linear motor in an axial direction according to the present invention.
Figure 4:
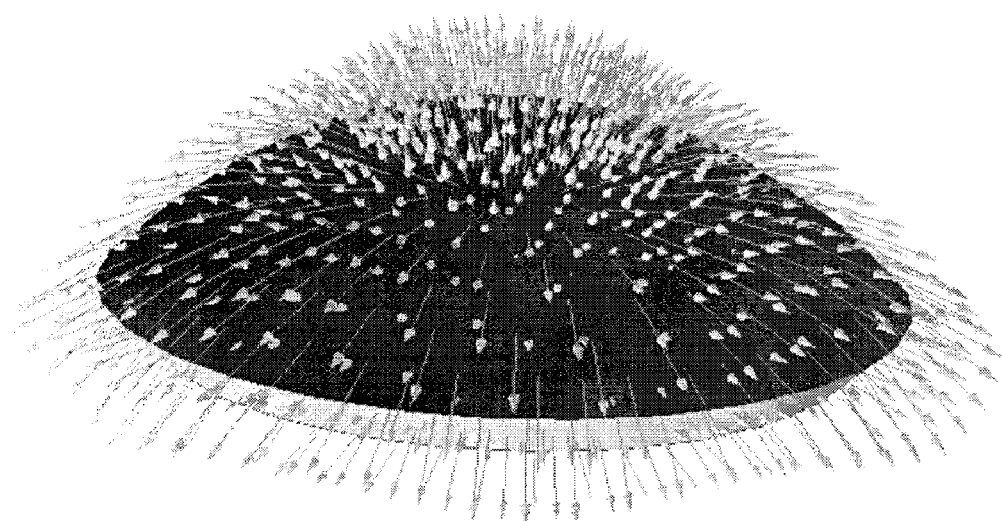
Figure 5:
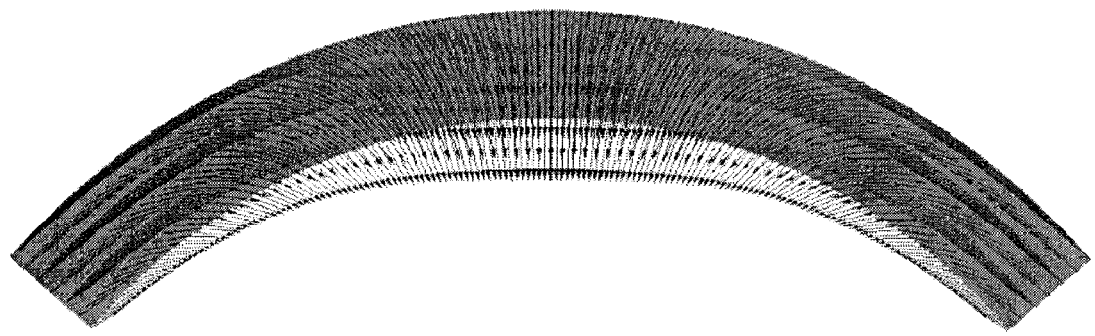
FIGS. 5(a) and 5(b) are views showing the results of the simulation of the displacement of a piezoelectric linear motor in a direction opposite the axial direction according to the present invention.
Figure 5:
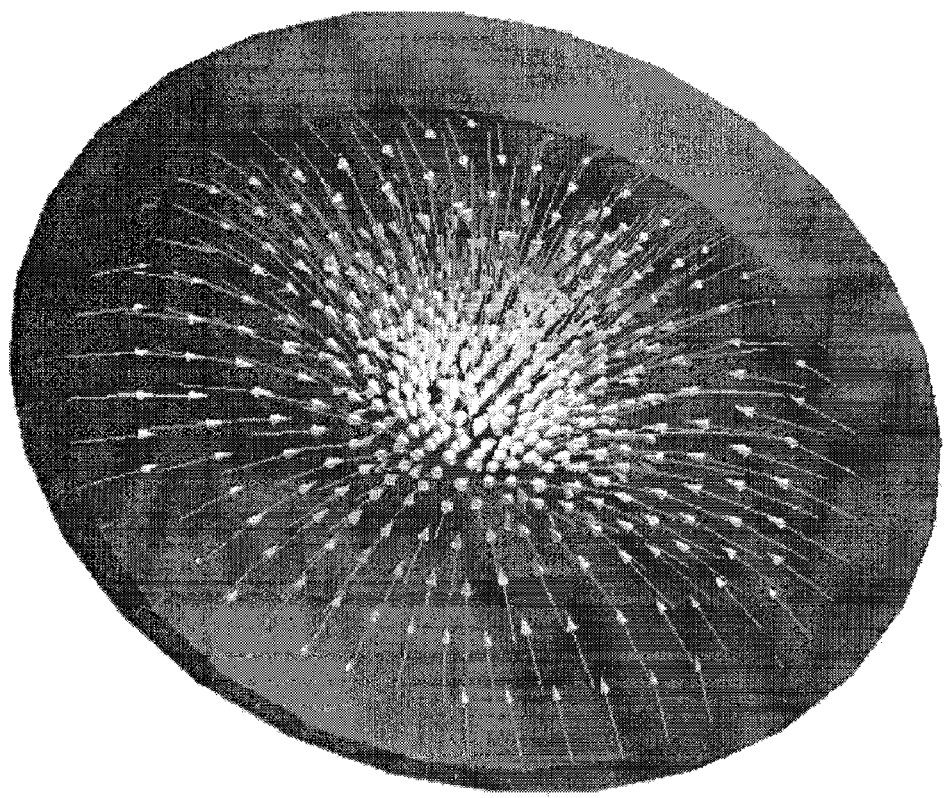

Next, when the piezoelectric ceramic 100 forming the piezoelectric motor is expanded in the axial direction and is contracted in the circumferential direction, and thus the thickness of the dome is increased, forces opposite those of FIG. 3 are applied to minute elements formed around the axis, and a resultant of the forces consequently acts in a direction opposite the protrusion direction of the axis, thus causing the center of the piezoelectric ceramic to be retracted. The results of a simulation performed in this case can be confirmed in FIGS. 5(a) and 5(b).

The vibration shaft 200 is fixed to the first surface of the piezoelectric ceramic 100 so that it moves in conjunction with the displacement of the piezoelectric ceramic 100. Typically, since the first surface of the piezoelectric ceramic 100 is preferably opposite the frame 500 or housing (not shown in the drawing) of the motor, the vibration shaft 200 must be fixed to the surface opposite the surface on which the frame 500 or the housing is disposed.

The movable element 300 is linearly driven through friction with the vibration shaft while coming into contact with the vibration shaft 200. On the contact portion between the movable element 300 and the vibration shaft 200, a certain frictional force is preferably maintained using a predetermined pressing element, such as a spring or a bolt.

Figure 6:
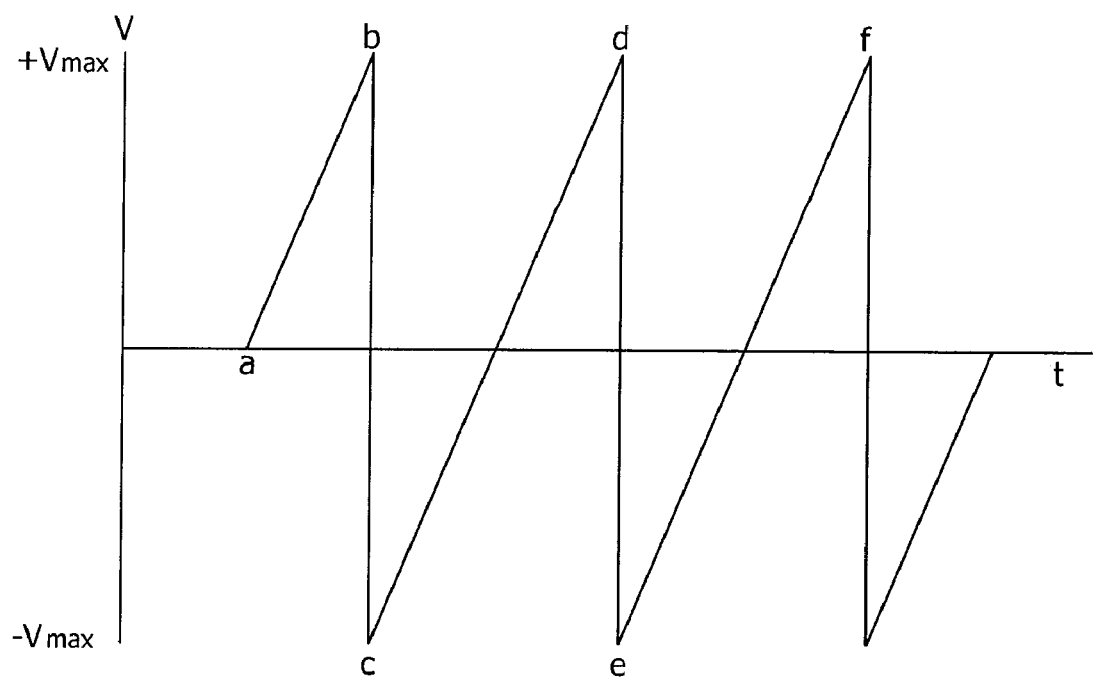
FIG. 6 is a graph showing the wave motion of a voltage applied to drive a piezoelectric linear motor according to the present invention.

When the vibration shaft 200 connected to the piezoelectric ceramic 100 is moved due to the vibration of the piezoelectric ceramic 100, the movable element 300 moves in the movement direction of the vibration shaft if the inertial force of the movable element 300 is less than the frictional force between it and the vibration shaft 200; otherwise the movable element 300 does not move, but only the vibration shaft 200 moves. Hereinafter, the principles of the driving of the piezoelectric linear motor, performed through the cooperation between the vibration shaft 200 and the movable element 300, are described in detail. In this case, it is assumed that a sawtooth driving voltage, as shown in FIG. 6, is applied to the piezoelectric linear motor of the present invention.

When the sawtooth voltage is applied to the piezoelectric ceramic 100, the vibration shaft on the piezoelectric ceramic 100 moves in the protrusion direction, but at a relatively low speed in intervals during which voltage varies at a low speed (a->b, c->d, and e->f) (these intervals are called interval A). Accordingly, the frictional force between the vibration shaft 200 and the movable element 300 becomes greater than the inertial force of the movable element 300, thus causing the vibration shaft 200 and the movable element 300 to move together.

In contrast, in intervals during which the voltage varies at a high speed (b->c and d->e) (these intervals are called interval B), the vibration shaft on the piezoelectric ceramic 100 moves in the direction opposite the protrusion direction of the vibration shaft, but at a relatively high speed. Accordingly, the inertial force of the movable element 300 becomes greater than the frictional force between the vibration shaft 200 and the movable element 300, thus causing only the vibration shaft 200 to move while the vibration shaft 200 slips through the movable element 300.

Consequently, as the interval A and the interval B are repeated, the movement displacement of the movable element 300 is accumulated, and thus the movable element 300 moves in the direction of the protrusion. If a voltage having a phase difference of 180° with respect to the sawtooth wave of FIG. 6 is applied, the movement displacement of the movable element 300 is accumulated in the direction opposite the protrusion direction, and thus the movable element 300 moves in the direction opposite the protrusion direction.

Meanwhile, the piezoelectric linear motor of the present invention may include a bracket 400 for supporting the piezoelectric ceramic, the bracket 400 being attached to the frame 500 or the housing through a fastening element, such as a bolt 600 and a nut 610. The bracket 400 also functions to limit the displacement of the piezoelectric ceramic 100, formed in the circumferential direction thereof, to a predetermined magnitude, and thus the axial displacement at the center of the piezoelectric ceramic 100 can be further amplified.

Figure 7:
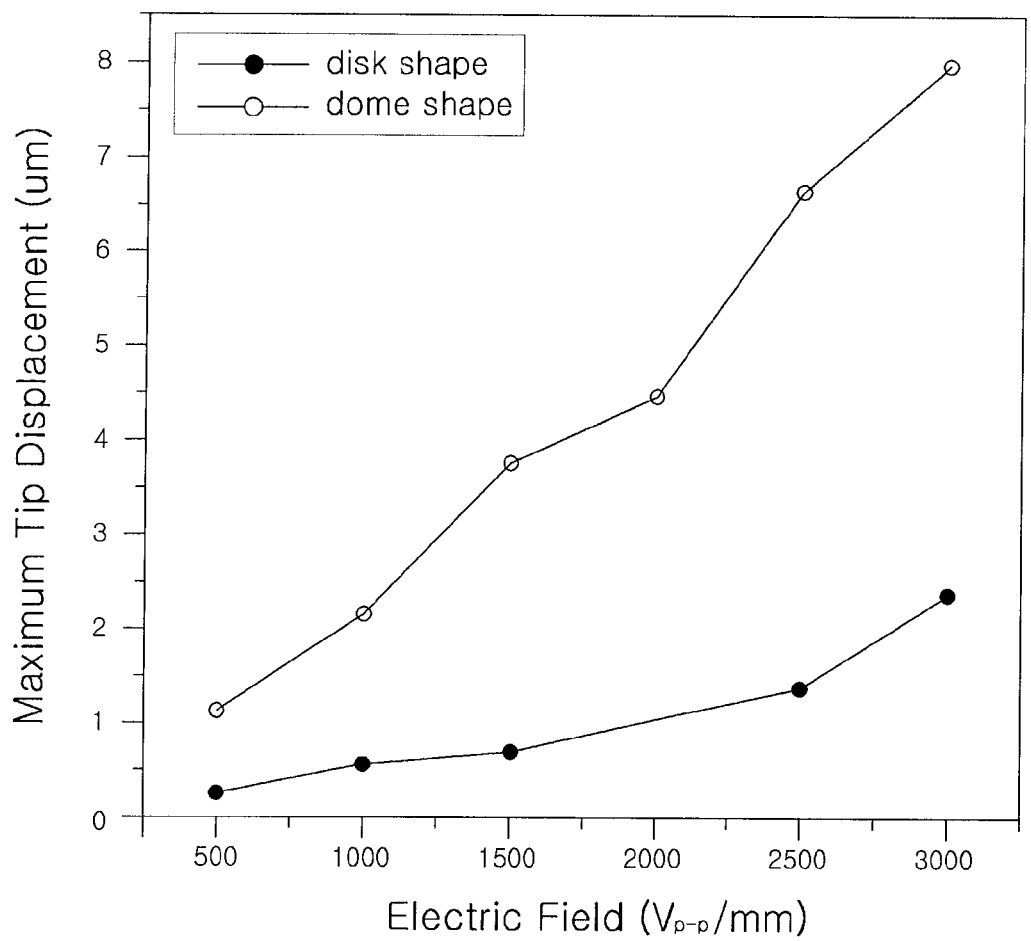
FIG. 7 is a graph showing experimental values obtained by measuring the movement displacements of the center portions of a conventional disk-shaped piezoelectric ceramic and the dome-shaped piezoelectric ceramic of the present invention.

Finally, the operation efficiencies of the piezoelectric linear motor of the present invention, which employs the dome-shaped piezoelectric ceramic, and the conventional piezoelectric linear motor, which employs a disk-shaped piezoelectric ceramic, are compared to each other with reference to FIG. 7. FIG. 7 is a graph showing experimental values obtained by measuring the movement displacements at the centers of the disk-shaped piezoelectric ceramic and the dome-shaped piezoelectric ceramic, each having a dimension of 28pi and 2t, using a laser interferometer. It can be seen through FIG. 7 that, as the intensity of an electric field increases, a remarkable difference occurs between the maximum tip displacement of the dome-shaped piezoelectric ceramic and the maximum tip displacement of the disk-shaped piezoelectric ceramic.

Although the preferred embodiments of the present invention have been disclosed for illustrative purposes, those skilled in the art will appreciate that various modifications are possible, without departing from the scope and spirit of the invention. Therefore, the scope of the present invention should be defined by the accompanying claims and equivalents thereof.

The invention claimed is:

1. A piezoelectric linear motor for providing enhanced displacement, comprising:
   a dome-shaped piezoelectric ceramic defining different electrodes on opposite surfaces thereof, the piezoelectric ceramic being deflectable when electrically energized upon different voltages applied to the electrodes, the piezoelectric ceramic having an arcuate sectional contour when undeflected;
   an elastic plate attached on the dome-shaped piezoelectric ceramic, the elastic plate straining the piezoelectric ceramic;
   a vibration shaft fixed to a first surface of the elastic plate so that the vibration shaft moves in conjunction with displacement of the piezoelectric ceramic and the elastic plate, a moveable direction of the dome-shaped piezoelectric ceramic equal to a moveable direction of the vibration shaft while the dome-shaped piezoelectric ceramic carrying the movement of the elastic plate and the vibration shaft; and
   a movable element linearly driven through friction with the vibration shaft while coming into contact with the vibration shaft.

2. The piezoelectric linear motor according to claim 1, further comprising a bracket for limiting displacement of the piezoelectric ceramic, formed in a circumferential direction thereof, to a predetermined magnitude while supporting the piezoelectric ceramic.

3. The piezoelectric linear motor according to claim 1, wherein the movable element and the vibration shaft are constructed such that a certain frictional force is maintained at a contact portion between the movable element and the vibration shaft by a predetermined pressing element.

4. The piezoelectric linear motor according to any of claims 1 to 3, wherein the movable element moves in a movement direction of the vibration shaft if an inertial force of the movable element is less than the frictional force between the movable element and the vibration shaft when the vibration shaft moves.

* * * * *